US010870360B2

(12) United States Patent
Campbell et al.

(10) Patent No.: US 10,870,360 B2
(45) Date of Patent: Dec. 22, 2020

(54) BATTERY MONITORING NETWORK

(71) Applicant: CPS Technology Holdings LLC, New York, NY (US)

(72) Inventors: Douglas C. Campbell, Northville, MI (US); Michael J. Sims, Zeeland, WI (US); Rodger W. Eich, Holland, MI (US); Thomas H. Morell, Spring Lake, MI (US); Dale A. Gospodarek, Kenosha, WI (US); James S. Symanski, Greenfield, WI (US)

(73) Assignee: CPS TECHNOLOGY HOLDINGS LLC, New York, NY (US)

( * ) Notice: Subject to any disclaimer, the term of this patent is extended or adjusted under 35 U.S.C. 154(b) by 760 days.

(21) Appl. No.: 14/084,019

(22) Filed: Nov. 19, 2013

(65) Prior Publication Data

US 2014/0229129 A1    Aug. 14, 2014

Related U.S. Application Data

(60) Provisional application No. 61/763,814, filed on Feb. 12, 2013.

(51) Int. Cl.
*G01R 31/382* (2019.01)
*B60L 50/15* (2019.01)
(Continued)

(52) U.S. Cl.
CPC .............. *B60L 50/15* (2019.02); *B60L 58/16* (2019.02); *G01R 31/382* (2019.01); *H04B 3/548* (2013.01);
(Continued)

(58) Field of Classification Search
CPC .................................................. G01R 31/3606
See application file for complete search history.

(56) References Cited

U.S. PATENT DOCUMENTS 5,521,443 A * 5/1996 Imura .................... B60L 1/003
307/10.2
5,949,219 A * 9/1999 Weiss ..................... G01N 21/31
320/136
(Continued)

FOREIGN PATENT DOCUMENTS

CN      102591325      *  2/2012
WO      2012001290 A2     1/2012
WO      2012149118 A1    11/2012

OTHER PUBLICATIONS

International Search Report and Written Opinion for PCT Application No. PCT/US2014/012554 dated Apr. 7, 2014; 11 pgs.

*Primary Examiner* — Lisa E Peters
(74) *Attorney, Agent, or Firm* — Boardman & Clark LLP

(57) ABSTRACT

A battery monitoring network is provided that includes a battery. The battery monitoring network also includes a battery monitoring system integrated within the battery. The battery monitoring system includes a diagnostic system configured to monitor or to store one or more battery parameters of the battery. Additionally, the battery monitoring system includes a transmitter configured to transmit data indicative of the one or more battery parameters of the battery. Furthermore, battery monitoring network includes a cloud-based computing network having a remote server configured to receive the data indicative of the one or more battery parameters of the battery. Moreover, the cloud-based computing network is configured to interface with a plurality of battery monitoring systems, and includes an internet connection.

20 Claims, 5 Drawing Sheets

(51) Int. Cl.
  *H04Q 9/00* (2006.01)
  *H04B 3/54* (2006.01)
  *B60L 58/16* (2019.01)
  *H01M 10/42* (2006.01)
(52) U.S. Cl.
  CPC .......... *H04Q 9/00* (2013.01); *B60L 2240/545* (2013.01); *B60L 2240/547* (2013.01); *B60L 2240/549* (2013.01); *B60L 2240/70* (2013.01); *B60L 2240/80* (2013.01); *B60L 2260/44* (2013.01); *H01M 2010/4278* (2013.01); *H04B 2203/5445* (2013.01); *H04B 2203/5458* (2013.01); *H04Q 2209/10* (2013.01); *H04Q 2209/40* (2013.01); *H04Q 2209/43* (2013.01); *H04Q 2209/883* (2013.01); *Y02T 10/70* (2013.01); *Y02T 10/7072* (2013.01); *Y02T 10/72* (2013.01); *Y02T 90/16* (2013.01)

(56) References Cited

U.S. PATENT DOCUMENTS

| | | | | |
|---|---|---|---|---|
| 6,002,240 A * | 12/1999 | McMahan | ......... | H01M 10/4257 320/150 |
| 6,252,406 B1 * | 6/2001 | Tegge | ......... | G06F 1/26 320/136 |
| 6,636,790 B1 * | 10/2003 | Lightner | ......... | G01M 15/102 701/31.4 |
| 7,576,517 B1 * | 8/2009 | Cotton | ......... | G01R 31/3606 320/132 |
| 2002/0016673 A1 * | 2/2002 | Flick | ......... | B60R 25/04 701/484 |
| 2002/0042280 A1 * | 4/2002 | Allen, Jr. | ......... | B60R 25/102 455/456.2 |
| 2002/0086718 A1 * | 7/2002 | Bigwood | ......... | G01R 31/3606 455/572 |
| 2003/0025481 A1 * | 2/2003 | Bertness | ......... | G01R 31/3648 320/155 |
| 2003/0038637 A1 * | 2/2003 | Bertness | ......... | G01R 31/3624 324/426 |
| 2004/0051532 A1 * | 3/2004 | Smith | ......... | G01R 31/3648 324/426 |
| 2006/0028323 A1 * | 2/2006 | Ohno | ......... | G08G 1/0962 340/425.5 |
| 2006/0290324 A1 * | 12/2006 | Jabaji | ......... | H02H 7/06 322/28 |
| 2009/0144001 A1 | 6/2009 | Leonard et al. | | |
| 2010/0256936 A1 * | 10/2010 | Darilek | ......... | G01R 31/3606 702/63 |
| 2011/0082621 A1 * | 4/2011 | Berkobin | ......... | B60L 11/1824 701/31.4 |
| 2011/0172940 A1 * | 7/2011 | Wood | ......... | G01R 31/362 702/63 |
| 2012/0068715 A1 * | 3/2012 | Martaeng | ......... | B60L 11/1857 324/434 |
| 2012/0086395 A1 | 4/2012 | Kim et al. | | |
| 2012/0091971 A1 * | 4/2012 | Syed | ......... | B60L 11/1851 320/162 |
| 2012/0197486 A1 * | 8/2012 | Elliott | ......... | G07C 5/008 701/33.2 |
| 2012/0299721 A1 * | 11/2012 | Jones | ......... | B60R 25/33 340/521 |
| 2012/0316813 A1 | 12/2012 | Langheim | | |
| 2012/0330475 A1 * | 12/2012 | Chen | ......... | G06F 1/263 700/292 |
| 2013/0109375 A1 * | 5/2013 | Zeiler | ......... | H04W 4/029 455/426.1 |
| 2013/0124006 A1 * | 5/2013 | Anantha | ......... | G06Q 50/01 701/1 |
| 2014/0342193 A1 * | 11/2014 | Mull | ......... | H01M 10/4257 429/50 |

\* cited by examiner

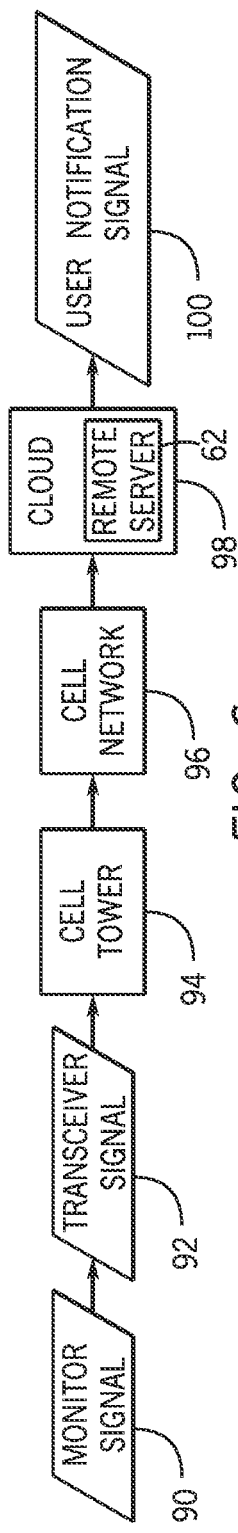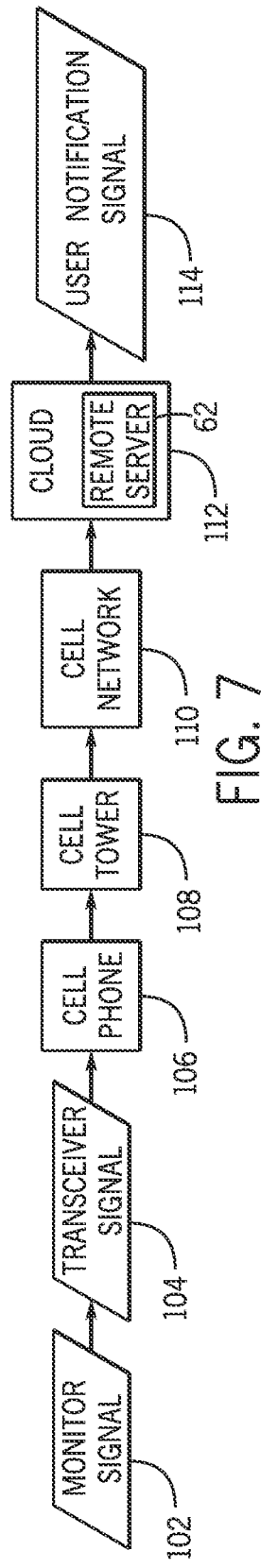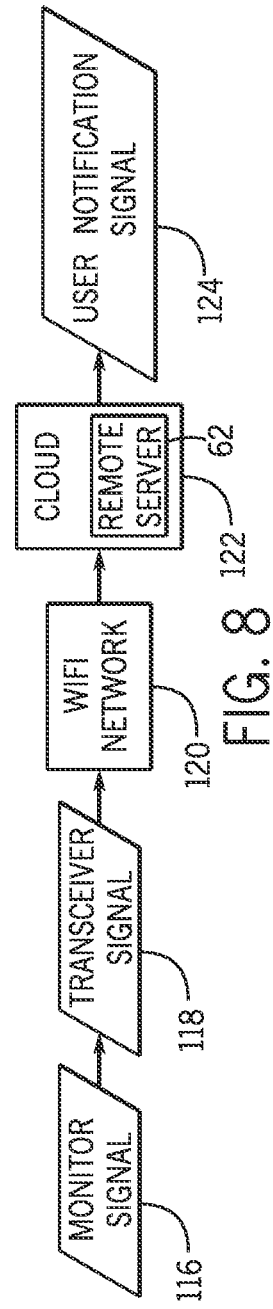

BATTERY MONITORING NETWORK

CROSS REFERENCE TO RELATED APPLICATION

This application claims priority from and the benefit of U.S. Provisional Application Ser. No. 61/763,814, entitled "BATTERY MONITORING NETWORK", filed Feb. 12, 2013, which is hereby incorporated by reference in its entirety.

BACKGROUND

The present disclosure relates generally to battery monitoring. More particularly, the disclosure relates to techniques for monitoring battery characteristics using cloud computing.

Certain devices (e.g., vehicles) incorporate batteries to enable device activation or operation of various electrical systems or motors within the device. However, current batteries lose efficiency or even fail after various periods or conditions of use. It is desirable to determine the state of the battery before the battery fails. Certain battery testers enable a user to determine whether the battery has a charge or is operable. However, these battery testers usually convey charge information through physical connections to terminals of the battery, but testing using a physical connection to the terminals requires special equipment that may not be available or requires visiting a maintenance location. Additionally, these terminals may become corroded or warped due to the environment in which the battery is operated (e.g., engine compartment) causing the terminals to fail when the connections to the terminals are removed or moved to connect a battery tester.

BRIEF DESCRIPTION

In one embodiment, a battery monitoring network includes a battery. The battery monitoring network also includes a battery monitoring system integrated within the battery. The battery monitoring system includes a diagnostic system configured to monitor or to store one or more battery parameters of the battery. Additionally, the battery monitoring system includes a transmitter configured to transmit data indicative of the one or more battery parameters of the battery. Furthermore, battery monitoring network includes a cloud-based computing network having a remote server configured to receive the data indicative of the one or more battery parameters of the battery. Moreover, the cloud-based computing network is configured to interface with a plurality of battery monitoring systems, and includes an internet connection.

In another embodiment, a method for monitoring a battery includes monitoring or storing one or more battery parameters of the battery via a battery monitoring system integrated within the battery. The method also includes transmitting data indicative of the one or more battery parameters of the battery to a cloud-based computing network. Moreover, the cloud-based computing network is configured to interface with a plurality of battery monitoring systems, and comprises an internet connection.

In a further embodiment, a battery monitoring network includes a battery. The battery monitoring network also includes a battery monitoring system integrated within the battery. Moreover, the battery monitoring system includes a diagnostic system configured to monitor or to store at least one characteristic of the battery. The battery monitoring system also includes a transmitter configured to transmit data indicative of the at least one characteristic of the battery. Furthermore, the battery monitoring network includes a cloud-based computing network. The cloud-based computing network includes a remote server configured to receive the data indicative of the at least one characteristic of the battery. The cloud-based computing network is configured to interface with a plurality of battery monitoring systems, and comprises an internet connection.

DRAWINGS

FIG. 6 is a flow diagram of an embodiment of a communication path from a battery monitoring system to a user through a cloud network via a direct connection between the battery monitoring system and a cell phone tower;

FIG. 7 is a flow diagram of an alternative embodiment of a communication path from a battery monitoring system to a user through a cloud network via a connection between the battery monitoring system and a cell phone; and FIG. 8 is a flow diagram of a further embodiment of a communication path from a battery monitoring system to a user through a cloud network via a WiFi network.

DETAILED DESCRIPTION

Figure 1:
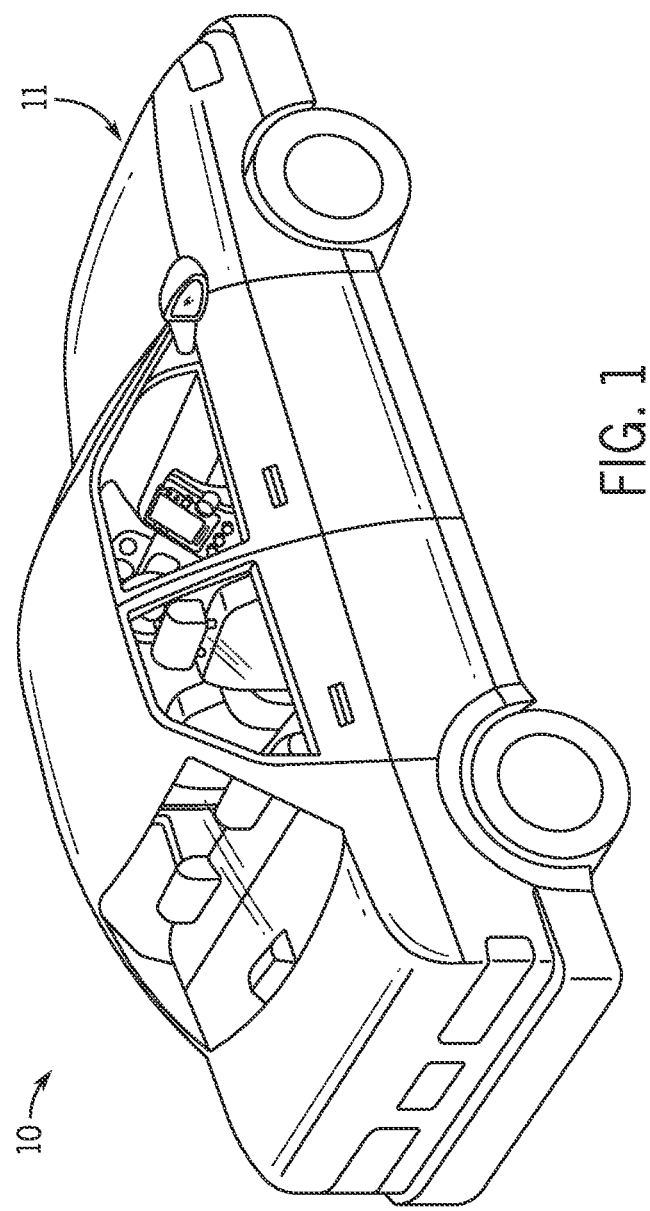
FIG. 1 is a perspective view of a vehicle that may employ a battery and a battery monitoring system.

One or more specific embodiments of the present invention will be described below. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present invention, the articles "a," "an," "the," and "said" are intended to mean that there are one or more of the elements. The terms "comprising," "including," and "having" are intended to be inclusive and mean that there may be additional elements other than the listed elements. Any examples of operating parameters and/or environmental conditions are not exclusive of other parameters/conditions of the disclosed embodiments.

As discussed in detail below, a battery for a device, such as a vehicle (e.g., automobile, watercraft, etc.) may include a battery monitoring system that monitors the battery for an estimated end of life based on electrical, chronological, and/or chemical parameters of the battery. In certain embodiments, the monitoring system may send the end of life information to a user via a remote server or device (e.g., through cloud computing), via a cellular network (e.g., to a cell phone), via email, via a television display, or through other notification methods. Additionally, the battery monitoring system may send other information to the user, such as suitable replacement batteries, locations for purchase, of suitable replacement batteries and/or inventories or prices of local and internet stores carrying suitable replacement batteries. In other embodiments, the battery monitoring system may communicate information to a user via an infrared or other light signal (e.g., indicator lights).

Additionally or alternatively, the battery monitoring system may remain in a standby mode until a signal is sent to the battery monitoring system to activate a diagnostic system within the battery monitoring system. Upon receipt of the activation signal, the diagnostic system initiates monitoring of battery parameters, and determines an estimated end of life of the battery based on the battery parameters. In other words, in some embodiments, the battery may be tested when a user initiates a diagnostic mode. In certain embodiments, the battery may automatically enter a diagnostic mode after a certain period of time after manufacture (e.g., testing in a manufacturing facility). The battery monitoring system then returns the expected end of life information and/or other information associated with the battery parameters to a user.

FIG. 1 is a perspective view of a vehicle 10 that may include a battery 11 and a battery monitoring system. In some embodiments, the battery 11 may be included in other devices, such as trains, boats, industrial plants, or other suitable devices requiring electrical power. In certain embodiments, the battery 11 includes one or more battery cells configured to power electronic components of the vehicle 10. For example, the vehicle 10 may include a hybrid propulsion system including a gas-powered engine and an electric motor. Monitoring various parameters of the battery 11 and/or each battery cell may provide data for efficiently operating the battery 11, and/or for determining an estimated end of life for the battery 11. For example, in certain embodiments, certain parameters of the battery, such as a time of use, a time since manufacture, the temperature of each battery cell, or group of cells, or other suitable parameters, may be monitored. In some embodiments, these parameters may be used to determine an estimated end of life of the battery. In some embodiments, the voltage of each cell may be measured to provide an accurate determination of the state of charge (e.g., charge status) and/or health of the battery to determine an estimated end of life of the battery.

Certain embodiments described below include a battery monitoring system integrated within the battery 11. In certain embodiments, the battery monitoring system includes a diagnostic system having at least one sensor configured to monitor one or more operational parameters (e.g., voltage, temperature, etc.) of the battery cell and/or store one or more additional parameters of the battery (e.g., size, manufacturing date, manufacturing location, capacity of the battery, shape, of the battery, technology of the battery (e.g., lead acid battery), etc.). Some embodiments include a processor for determining an end of life of the battery based on the monitored parameters, and a transmitter configured to output a signal indicative of the end of life of the battery and/or the operational parameter. In certain embodiments, the battery monitoring system also includes a receiver configured to receive a signal to activate the diagnostic system. In some embodiments, the receiver and transmitter may be elements of a single transceiver. As discussed in detail below, in some embodiments, the battery monitoring system may be integrated within a sealed housing of the battery 11 to substantially reduce or eliminate the possibility of fumes or particulates, present in an engine compartment from interfering with operation of the battery monitoring system. Accordingly, certain embodiments include wireless/contactless methods of communication between the battery monitoring system and an external device.

In certain embodiments, a transmitter of the battery monitoring system is configured to output a signal indicative of the end of life of the battery and/or an operational parameter of the battery via a wireless communication link. In such embodiments, data cables, which may be employed to communicatively couple the battery monitoring system to a remote receiver, are obviated. The reduction in wiring may substantially reduce the weight and manufacturing costs of the battery monitoring system. In addition, the reduced number of connections may enhance the reliability and efficiency of the monitoring system in the potentially corrosive environment of a vehicle engine compartment. Additionally, the wireless link may be established between the transmitter and a cell phone, cell tower, wireless local area network connection (e.g., WiFi), dedicated infrared device (e.g., maintenance device), manufacturer battery testing device, or other such devices.

Figure 2:
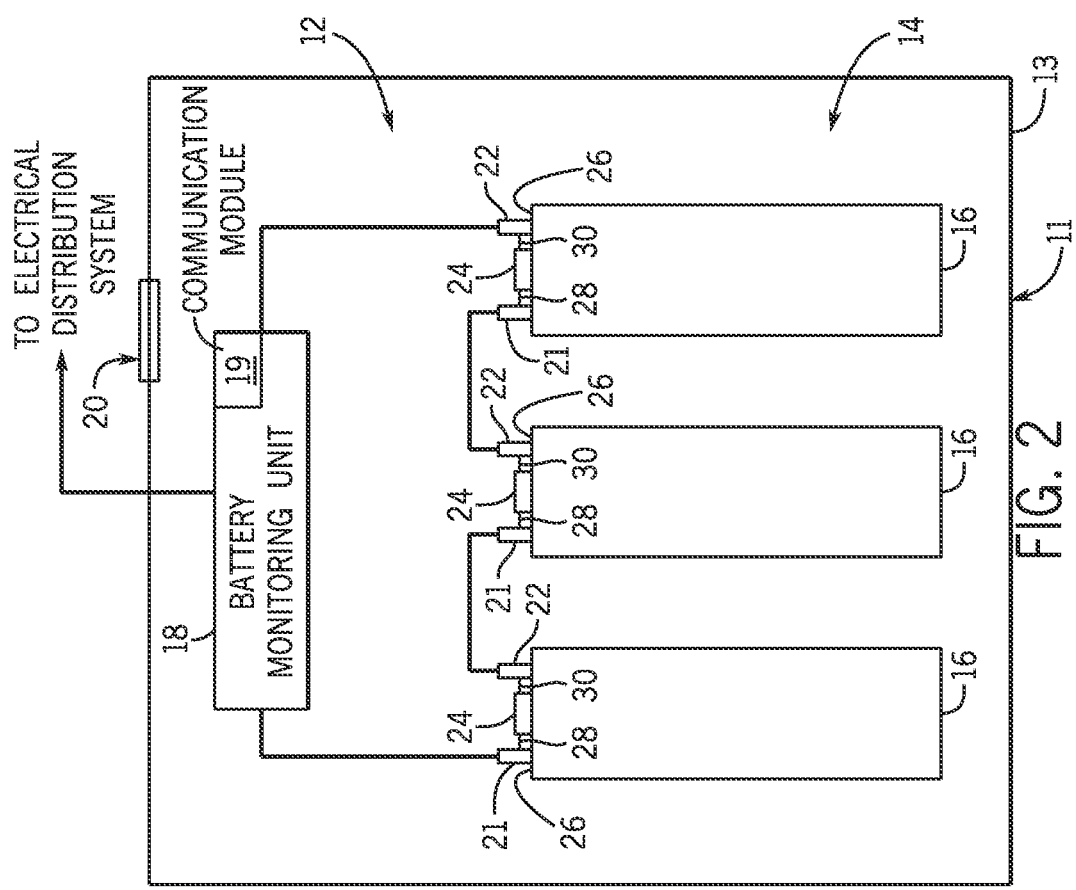
FIG. 2 is a block diagram of an embodiment of a battery having a battery monitoring system.

FIG. 2 is a block diagram of an embodiment of a battery 11 having an integrated battery monitoring system 12 disposed within a battery housing 13. As will be appreciated, by locating the battery monitoring system 12 within the battery housing 13, the battery housing 13 protects the battery monitoring system 12 and its electrical components from the harsh environment typically present surrounding a battery. However, in certain embodiments, the battery monitoring system 12 may be located remote from the battery 11 (e.g., within a separate housing). As illustrated, the battery 11 includes an array 14 of battery cells 16 connected in series to a battery monitoring unit 18. While three battery cells 16 are included within the illustrated array 14, it should be appreciated that more or fewer cells 16 may be employed in alternative array configurations. For example, in certain embodiments, multiple battery cells 16 may be grouped into modules, with multiple modules forming the array 14. In such embodiments, a first bus bar may be electrically coupled to a positive terminal 21 of each cell 16 within a module, and a second bus bar may be electrically coupled to a negative terminal 22 of each cell 16 within the module. The bus bars, in turn, may be electrically coupled to the battery monitoring unit 18 and configured to transfer an electrical power signal from the battery cells 16 to the battery monitoring unit 18. Multiple modules may be connected in series to form the array 14, and to provide a desired electrical power output to the vehicle electrical system. In alternative embodiments, individual battery cells 16 and/or modules may be connected in parallel, or any other suitable arrangement involving parallel and serial configurations.

Additionally, the battery monitoring unit 18 includes a communication module 19 configured to receive and/or transmit signals from external devices. For example, in some embodiments, the communication module 19 may include a light emitting transceiver that communicates with external devices. In such embodiments, a translucent/transparent window 20 may be included in the battery housing 13. The window is configured to enable optical light signals (e.g., infrared signals) to pass through the battery housing 13. For example, in some embodiments, the communications module 19 may receive an optical light signal from a remote device that instructs the battery monitoring unit 18 to transition from a standby mode to a diagnostic mode. The battery monitoring unit 18 may then respond to the remote device using flashing lights or infrared signals that pass through the translucent/transparent window 20. Alternatively, the battery housing 13 may be configured to enable light signals (e.g., certain patterns or colors) or infrared signals to pass through any surface of the battery housing 13 without the inclusion of a window 20 by constructing the battery housing of a transparent or translucent material. Moreover, certain embodiments of the battery monitoring system 12 may include a communication module 19 that includes a transmitter capable of communicating through radio frequency signals, such as via a Bluetooth connection, a wireless local area network connection, a cell phone data connection (e.g., code division multiple access), or other suitable connection. In some embodiments, the battery monitoring unit 18 may initiate a diagnostic mode after a certain lapse of time. For example, in some embodiments, the battery monitoring unit 18 may enter into a diagnostic mode after a tracked time in the battery monitoring unit 18 has crossed a threshold, such as 1, 2, 3, 4, 5, or more minutes after manufacture of the battery 11.

In the illustrated embodiment, a measurement device 24 is mounted to an exterior surface 26 of each battery cell 16. In certain embodiments, the measurement device 24 is affixed to the exterior surface 26. As discussed in detail below, each self-contained measurement device 24 includes one or more sensors configured to monitor an operational parameter of the battery cell 24, and a transmitter configured to output a signal indicative of the operational parameter to the battery monitoring unit 18.

As illustrated, each self-contained measurement device 24 includes a first lead 28 coupled to the positive terminal 21 of a respective battery cell 16, and a second lead 30 coupled to the negative terminal 22 of the battery cell 16. In certain embodiments, the transmitter is communicatively coupled to the first and second leads 28 and 30, and configured to output the signal indicative of the operational parameter via modulation of a power signal output by the battery cell 16. In further embodiments, the sensor (e.g., voltmeter) may be coupled to the first and second leads 28 and 30, and configured to measure a parameter of the power signal (e.g., voltage). Although the illustrated embodiment includes one self-contained measurement device 24 for each cell 16, some embodiments may include more or fewer self-contained measurement devices 24. For example, some embodiments may include self-contained battery measurement devices 24 that are configured to monitor or store overall battery parameters for the battery (e.g., battery voltage rather than cell voltage, battery temperature, battery type, battery size, etc.). In some embodiments, the self-contained measurement devices 24 may be stored in suitable locations other than those illustrated. For example, in some embodiments, one or more self-contained measurement devices 24 may be located on the battery housing 13, and used to monitor the temperature within the battery housing 13. Additionally, in some embodiments, one or more self-contained measurement devices 24 may be included within the battery monitoring unit 18, and may measure the voltage of the array 14 of batteries, a cell 16, or a group of cells 16.

In embodiments in which the self-contained measurement device 24 is mounted directly to the exterior surface 26 of the battery cell 16, the measurement device 24 may monitor the temperature of each individual battery cell 16. For example, in certain embodiments, the self-contained measurement device 24 includes a temperature sensor, such as a thermocouple. By placing the temperature sensor in direct contact with the exterior surface 26 of the cell 16, the temperature sensor may accurately measure the battery cell temperature. In other embodiments, the components of the self-contained measurement system 24, including the temperature sensor, may be coupled to the surface of an integrated circuit. In such embodiments, mounting the integrated circuit directly to the exterior surface 26 of the cell 16 enables the surface-mounted temperature sensor to measure the temperature of the cell 16.

In embodiments in which the self-contained measurement device 24 is mounted to the battery cell 16, spring connectors, wire harnesses, or flex circuit assemblies which couple PCBs to the terminals 21 and 22 may be obviated. Consequently, the possibility of signal degradation associated with worn connectors may be substantially reduced or eliminated. In addition, mounting the measurement device 24 directly to the battery cell 16 enables the cells 16 to be mounted in a variety of orientations and locations within the vehicle 10.

Figure 3:
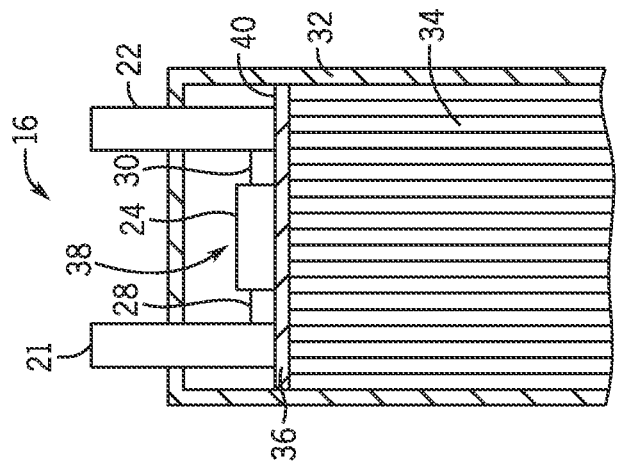
FIG. 3 is a schematic view of an embodiment of a battery cell that may be employed within the battery of FIG. 2, having a self-contained measurement device.

FIG. 3 is a cross-sectional view of an embodiment of a battery cell 16 including a self-contained measurement device 24. In the illustrated embodiment, the battery cell 16 includes an exterior casing 32, a power storage assembly 34, and an insulator 36. As will be appreciated, the power storage assembly 34 includes an anode sheet, a cathode sheet, and a separator disposed between the anode sheet and the cathode sheet. In certain configurations, the sheets are wrapped in a spiral configuration and disposed within an electrolyte. Electrical power may be transferred to and extracted from the power storage assembly 34 via the positive terminal 21 and the negative terminal 22.

As illustrated, the self-contained measurement device 24 is disposed within a gas-venting region 38 between the insulator 36 and the exterior casing 32. Specifically, the measurement device 24 is mounted to an interior surface 40 of the battery cell 16 adjacent to the power storage assembly 34. In certain embodiments, the measurement device 24 is permanently affixed to the interior surface 40. While the measurement device 24 is mounted within the gas-venting region 38 in the present embodiment, it should be appreciated that the measurement device 24 may be mounted to other interior surfaces within the battery cell 16 in alternative embodiments. Mounting the self-contained measurement device 24 within the battery cell 16 may enable the temperature sensor to provide a more accurate measurement than configurations in which the measurement device 24 is mounted on an exterior surface of the battery cell 16. In addition, because the measurement device 24 may be positioned proximate to the anode and cathode sheets, the device 24 may be configured to directly measure the state of charge within each battery cell 16.

As will be appreciated, certain battery monitoring systems compare the voltage of the battery cell 16 to an established voltage profile to determine the state of charge. Unfortunately, because the voltage profile varies based on load, an inaccurate state of charge may be reported to a control system or vehicle operator, resulting in inefficient operation of the battery array 14. To provide a more accurate determination of the state of charge, the self-contained measurement device 24 may include a sensor coupled to the anode sheet and to cathode sheet, and configured to directly measure the charge on the sheets. As a result, a more accurate state of charge may be determined, thereby facilitating efficient determination of the end of life of the battery 11.

Figure 4:
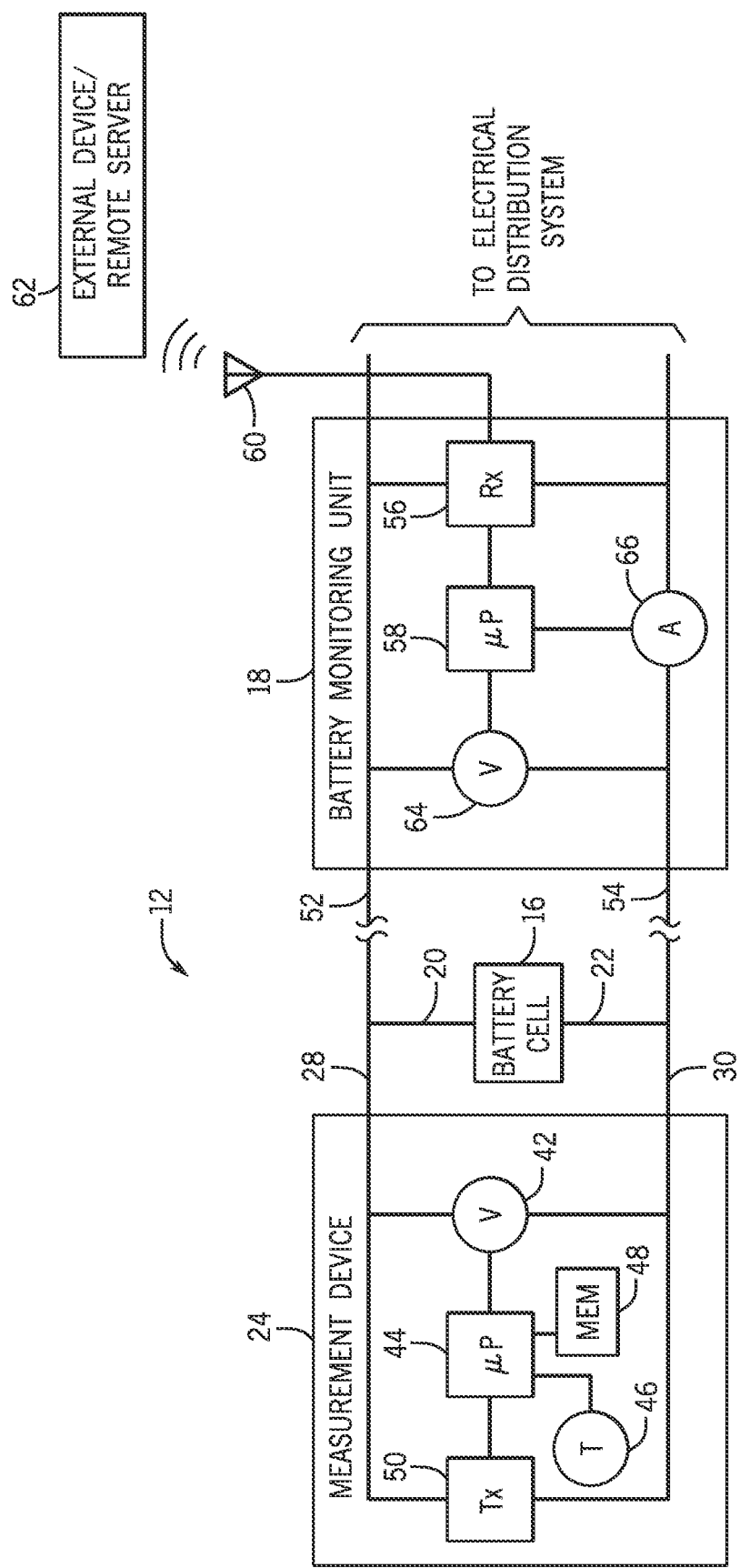
FIG. 4 is a block diagram of an embodiment of a battery monitoring system; illustrating a battery monitoring unit.

FIG. 4 is a schematic diagram of an embodiment of the battery monitoring system 12, including the self-contained measurement device 24 and the battery management unit 18. As illustrated, the self-contained measurement device 24 includes a voltmeter 42 electrically coupled to the first lead 28 and to the second lead 30. Because the first lead 28 is electrically connected to the positive battery terminal 21 and the second lead 30 is electrically connected to the negative battery terminal 22, the voltmeter 42 measures the voltage across the battery cell 16. In the illustrated embodiment, the voltmeter 42 is communicatively coupled to a microprocessor 44. It should be noted that, while reference is made in the present discussion to a microprocessor, any suitable processing circuitry may be employed, such as field programmable gate arrays, and so forth. The microprocessor 44 is configured to receive a signal from the voltmeter 42 indicative of the measured voltage, and to compute the voltage based on the signal. For example, in certain embodiments, the voltmeter 42 may output an analog signal proportional to the measured voltage. In such embodiments, the microprocessor 44 may be configured to convert the analog signal into a digital signal, and to determine the voltage based on the digital signal.

In the illustrated embodiment, the measurement device 24 also includes a temperature sensor 46 communicatively coupled to the microprocessor 44. As previously discussed, the temperature sensor 46 is in direct contact with an interior surface 40 or an exterior surface 26 of the battery cell 16. Accordingly, the temperature sensor 46 outputs a signal indicative of the battery cell temperature, and the microprocessor 44 determines the cell temperature based on the signal. For example, in certain embodiments, the temperature sensor 46 may output an analog signal proportional to the measured temperature. In such embodiments, the microprocessor 44 may be configured to convert the analog signal into a digital signal, and to determine the temperature based on the digital signal.

While the illustrated measurement device 24 includes a voltmeter 42 and a temperature sensor 46, it should be appreciated that alternative embodiments may include additional sensors configured to monitor other operational parameters of the battery cell 16. For example, in certain embodiments, the measurement device 24 may include a sensor configured to measure the state of charge within the battery cell 16, and/or an ammeter configured to determine current being provided by the cell. In other embodiments, the measurement device 24 may include a pressure sensor configured to detect an excessive pressure within the gas venting region 38, for example. In some embodiments, the measurement device 24 may include an ohmmeter, or other sensor configured to monitor an electrical, physical, or chemical parameter of the battery cell 16.

In certain embodiments, the illustrated measurement device 24 also includes a memory 48 communicatively coupled to the microprocessor 44. The memory 48 may be configured to store battery cell identification information, operational parameter history information, battery cell type information, and/or usage information. For example, a unique identification number may be associated with each battery cell 16 and stored within the memory 48. In such a configuration, the battery management unit 18 may identify a particular battery cell 16 based on the unique identification number, thereby facilitating communication between the measurement device 24 and the battery management unit 18. The memory may also be configured to store historical values of measured operational parameters. For example, the memory 48 may store the maximum voltage measured by the voltmeter 42 and/or the maximum temperature measured by the temperature sensor 46. Such information may be useful for diagnosing faults within the battery cell 16. Furthermore, the memory 48 may be configured to store usage information, such as average load, maximum load, duration of operation, or other parameters that may be useful for monitoring the operational status of the battery cell 16.

In the illustrated embodiment, the measurement device 24 includes a transmitter 50 configured to output the operational parameter (e.g., voltage, temperature, etc.) to the battery monitoring unit 18. As illustrated, the transmitter 50 is communicatively coupled to the first lead 28 and to the second lead 30. Consequently, the transmitter 50 is communicatively coupled to a first power transmission conductor 52 extending between the positive terminal 21 of the battery cell 16 and the battery management unit 18, and to a second power transmission conductor 54 extending between the negative terminal 22 of the battery cell 16 and the battery management unit 18. The first and second power transmission conductors 52 and 54 are configured to transfer a power signal from the battery cell 16 to the battery monitoring unit 18. In the present embodiment, the transmitter 50 is configured to output a signal indicative of the operational parameter (e.g., voltage, temperature, etc.) via modulation of the power signal. Specifically, the battery cell 16 is configured to output a direct current (DC) signal to the battery management unit 18. The transmitter 50 is configured to modulate the DC signal with an alternating current (AC) signal indicative of the value of the operational parameter. Any suitable data-over-power modulation, superposition or transmission scheme may be employed.

For example, the voltmeter 42 may output an analog signal to the microprocessor 44 indicative of the measured voltage across the battery cell 16. The microprocessor 44 converts the analog signal from the voltmeter 42 into a digital signal, and determines the voltage based on the digital signal. The microprocessor 44 then outputs a digital signal indicative of the measured voltage to the transmitter 50. The transmitter converts the digital signal into an analog AC signal, and modulates the DC power signal based on the AC voltage signal. A similar process may be utilized to output measured temperature values or other operational parameters.

In certain embodiments, the transmitter 50 may be configured to transmit multiple signals indicative of multiple parameters simultaneously or sequentially. For example, the transmitter 50 and/or microprocessor 44 may be configured to multiplex a voltage signal and a temperature signal, and to transmit the multiplexed signal to the battery management unit 18. As will be appreciated, additional operational parameters (e.g., pressure, amperage, resistance, etc.) may be included in the multiplexed signal. In alternative embodiments, the voltage signal and the temperature signal may be transmitted sequentially (e.g., voltage signal first and temperature signal second). Additionally, in certain embodiments the transmitter 50 may be configured to wireless transmit information from the processor 44 to the battery monitoring unit 18. In further embodiments, the processor 44 may be omitted, with raw data being sent from respective sensors (e.g., voltmeter 42) to a central processor in the battery monitoring unit 18.

As illustrated, the battery management unit 18 includes a transceiver 56 electrically coupled to the power transmission conductors 52 and 54. The transceiver 56 is configured to receive the AC signal indicative of the measured parameter by monitoring the modulation of the DC power signal. The transceiver 56 is also configured to convert the AC signal into a digital signal indicative of the value of the measured parameter, and to output the digital signal to a microprocessor 58. The transceiver 56 is configured to transmit information about the parameters and/or the end of life of the battery 12 to a user or an external device/remote server 62 via an antenna 60 or other suitable connection. As will be discussed in detail below, in certain embodiments, the transceiver 56 may send information via the antenna 60 or a direct connection to an external device/remote server 62 to enable the external device/remote server 62 to further process the information. For example, in some embodiments, the transceiver 56 may send infrared signals or activate blinking lights to show various battery conditions (e.g., indicating that battery needs replacement).

In certain embodiments, the transceiver 56 may be configured to receive wireless signals from the transmitter 50 and/or external sources. In such embodiments, the wireless communication link between the transmitter 50 and the transceiver 56 may be bidirectional. For example, the transceiver 56 may be configured to scan for an activation signal through the antenna 60 or other suitable connection. In some embodiments, the transceiver 56 receives an activation signal, the transceiver 56 is configured to send a signal to the transmitter 50 to activate the measurement device 24. In such embodiments, if no activation signal is received, each measurement device 24 remains in a standby mode. In some embodiments, the battery monitoring system 12 may activate a standby mode (e.g., low power mode) upon receiving a standby signal from a remote device (e.g., testing device at a manufacture location) through the transceiver 56. In such embodiments, the battery monitoring system 12 may deactivate the standby mode upon the occurrence of one or more factors. For example, in certain embodiments, the battery monitoring system 12 may deactivate the standby mode and return to a normal operation mode when the battery monitoring system 12 determines that a voltage changes in the battery, a current draw on the battery surpasses a certain threshold (e.g., a current spike), a length of standby (e.g., time in standby mode has surpassed a standby mode time threshold), another suitable factor, or some combination thereof. Additionally or alternatively, some embodiments of the battery monitoring system 12 may deactivate the standby mode upon receipt of a signal via the transceiver 56 (e.g., the activation signal, a repeat of the signal that caused the standby mode, a signal different from the activation or standby signals).

Furthermore, certain embodiments of the measurement device 24 may activate upon receipt of the activation signal. In some embodiments, the measurement device 24 may activate without an activation signal. For example, in some embodiments, the measurement device 24 may activate after a certain period of time. In some embodiments, this period may be a fixed length (e.g., once per day, etc.). In other embodiments, the period may vary over time. For example, some embodiments of the measurement device 24 may activate at a shorter period initially and activate using a longer period after a certain period of time. In certain embodiments, once the period crosses some length threshold (e.g., 1 week), the measurement device 24 may remain in a standby mode until the measurement device 24 is activated.

The microprocessor 58 may output the operational parameter to a display, compute the battery cell state of charge, estimate an end of life, and/or direct information to the transceiver for wirelessly transmission. In certain embodiments, the battery management unit 18 includes a voltmeter 64 and an ammeter 66 communicatively coupled to the microprocessor 58, and configured to monitor the total voltage and amperage of the battery array 14. In some embodiments, the temperature sensor 46 may be included in the battery monitoring unit 18 to measure temperature of the entire battery housing 13. In such embodiments, individual measurement devices 24 may be located separate from the battery monitoring unit 18 by using the voltmeter 64 and ammeter 66 to determine the voltage and amperage parameters of the entire battery array 14 rather than individual cells 16. As previously discussed, the battery monitoring system 12 and the transceiver 56 are located within the battery housing thereby protecting the electronic components from the environment of the vehicle engine compartment. Furthermore, in some embodiments, one or more measurement devices 24 may be located in the battery monitoring unit 18 rather than on an exterior surface 26 of a battery cell 16.

The measurement device components described above may be discrete components mounted to a PCB, or elements of an integrated circuit. Furthermore, as previously discussed, the measurement device 24 may be coupled to the exterior surface 26 of the battery cell 16, the interior surface 40 of the battery cell 16, or the battery housing 13. While a single self-contained measurement device 24 is shown in the illustrated embodiment, it should be appreciated that alternative embodiments may include multiple measurement devices (e.g., one measurement device per battery cell 16 or group of cells 16) communicatively coupled to the battery monitoring unit 18. In such embodiments, each measurement device 24 may be configured to transmit a unique identification number to the battery monitoring unit 18 along with the AC signal indicative of the operational parameter. Consequently, the battery monitoring unit 18 may associate each received signal with a particular measurement device 24. Alternatively, some embodiments may include only one measurement device 24 incorporated within the battery monitoring unit 18.

Figure 5:
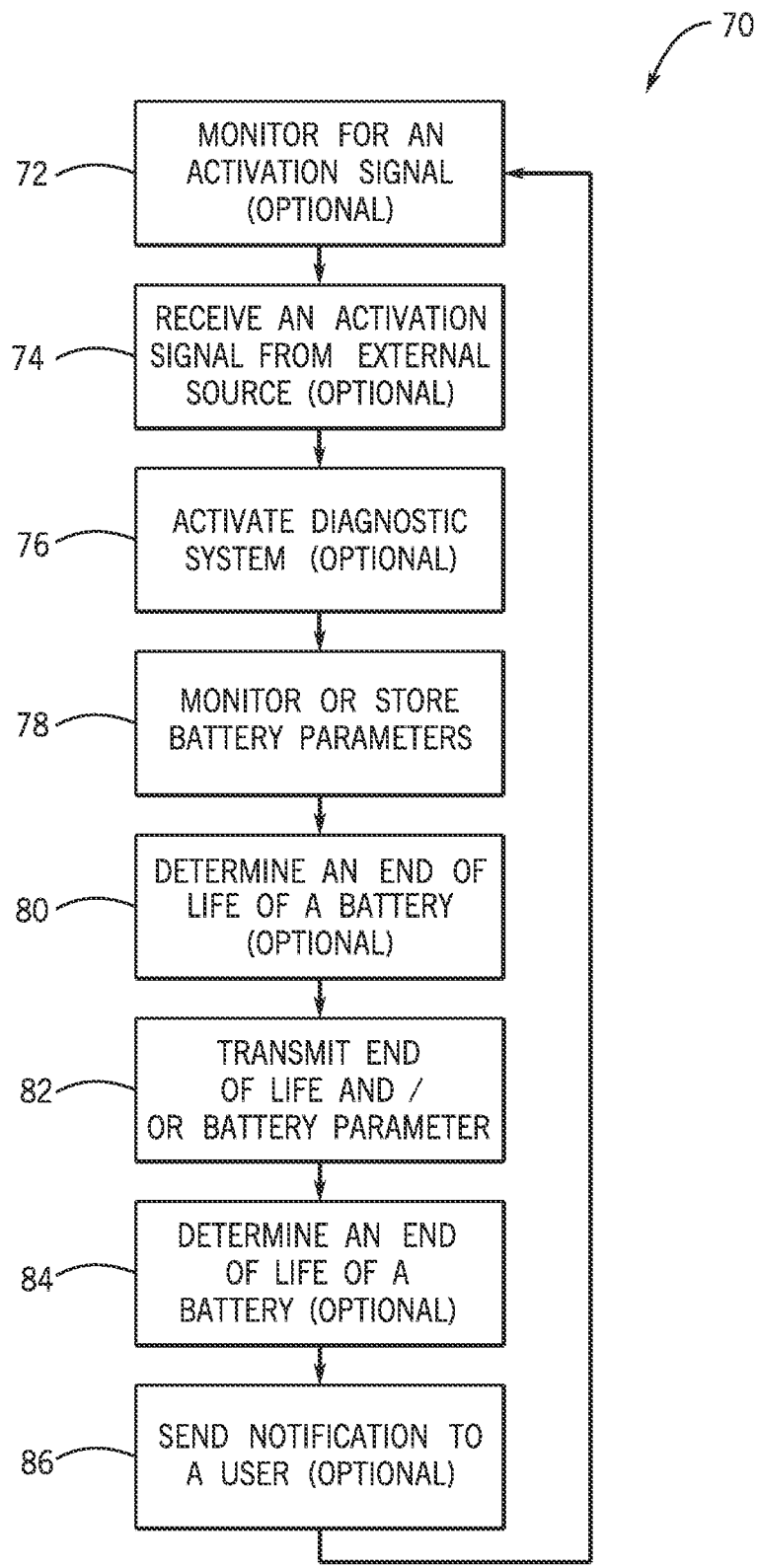
FIG. 5 is a flow diagram of an embodiment of a process for monitoring a battery using a battery monitoring system.

FIG. 5 is a flow diagram of an embodiment of a process 70 for monitoring a battery. In some embodiments, a diagnostic portion (e.g., measurement device 24) remains in a standby mode until an activation signal is received. Accordingly, the transceiver 56 monitors for a signal (block 72), such as an activation signal. The transceiver 56 then receives the signal from an external source (block 74). For example, the activation signal may be sent using a transmitter remote from the system (e.g. outside the vehicle 10). In such embodiments, the activation signal may include flashing lights of various colors (e.g., infrared) and/or frequencies that pass through the translucent window 20 and/or the battery housing 13. In embodiments that include an infrared activation signal, the transceiver 56 is configured to activate the diagnostic system in response to any infrared signal. For example, a generic infrared television remote may be used to send any infrared signal to the transceiver 56 to activate the measurement devices 24. In other embodiments, activation may only be initiated in response to certain infrared commands. In such embodiments, a dedicated maintenance device may be used to activate the diagnostic system at various maintenance locations, points of purchase locations, or manufacture locations. Alternatively, general purpose devices with infrared capability may be programmed to activate the measurement devices 24. For example, cell phones having infrared capabilities or compatible infrared peripheries (e.g., an infrared dongle) may be used to activate the measurement devices using programmed sequences. In other embodiments, diagnostic systems may be activated through a wireless connection to a cell phone, cell tower, and/or WiFi network.

In embodiments in which the diagnostic system remains in standby mode absent an activation signal, the transceiver 56 transmits a signal to the measurement devices 24 (e.g., either directly to the measurement devices 24 or through transmitter 46) to activate the diagnostic systems (block 76)

when the transceiver 56 receives an activation signal from an external source (e.g., the external device/remote server 62). However, some embodiments may include a diagnostic system that is configured to remain in continuous operation. In such embodiments, the diagnostic systems are activated when the system is turned on, or the battery has a charge, receives a current draw, or other variable factors. In some embodiments, the battery monitoring unit 18 may initiate a diagnostic mode after a certain lapse of time. For example, in some embodiments, the battery monitoring unit 18 may enter into a diagnostic mode after a tracked time in the battery monitoring unit 18 has crossed a threshold, such as 1, 2, 3, 4, 5, or more minutes after manufacture of the battery 11. The battery monitoring system 12 monitors battery parameters (e.g., voltage, current, and temperature) for the battery 11 using the diagnostic system and/or stores additional parameters (e.g., battery size, battery shape, etc.) (block 78). In some embodiments, the battery monitoring system 12 determines an end of life of the battery 11 using measured battery parameters (block 80). For example, when voltage produced by the battery declines over a certain period of time, the battery monitoring system 12 may calculate a period of time (e.g., days) left until the battery 11 is expected to need replacement. Alternatively or additionally, the battery monitoring system 12 may track the period of time that the battery has been used to determine whether the battery 11 should be replaced (e.g., by coupling the duration of operation to the expected battery lifetime).

The end of life information (if previously determined) and/or monitored battery parameters are transmitted (block 82) to a user or to the external device/remote server 62. In some embodiments, the transmittal may include illuminating an LED on the battery 12, or other location in the system (e.g., vehicle 10). However, certain embodiments of the battery monitoring system 12 may transmit the information to a remote server or to an infrared device capable of interpreting the transmittal. The transmittal may also include other relevant information such as location of the system (e.g., vehicle 10), additional determined battery parameters (e.g., battery manufacturer and/or model), and/or information about the system (e.g., vehicle model for the vehicle 10, location, engine size, battery size, other additional parameters, etc.). The transmittal may be performed on demand (e.g., in response to an activation signal or another query), or may be transmitted under certain conditions. For example, the end of life/battery parameter information may be transmitted when an expected remaining battery lifetime falls below a certain threshold (e.g., 3 months), and/or various battery parameters may be transmitted when the parameters cross certain thresholds (e.g., voltage drops below minimum voltage threshold).

In some embodiments that the battery monitoring system 10 does not calculate and/or transmit the end of life. The end of life may be determined using a remote device, such as a cloud-based network or remote server (block 84). In various embodiments, a notification may be sent to the user, notifying the user of the end of life information and/or battery parameters (block 86). In certain embodiments, the notification may occur automatically in response to the transmittal in block 82. However, in other embodiments, the notifications may be sent when the transmittal includes certain conditions, such as when an estimated end of life is less than a threshold value (e.g., 1 month), or when operating parameters exceed a certain threshold valve (e.g., battery voltage less than minimum voltage). In some embodiments, the notification may include additional information. For example, the notification may include information about service locations in relation to a determined location of the battery (e.g., from a global positioning system in the vehicle or on a portable electronic device). Additionally, the notifications may include coupons or advertisements for batteries suitable for use in the system (e.g., vehicle 10) for which battery replacement is desired. The notifications may also include battery drain information that may assist the user in determining whether other system issues exist that may have caused a premature end of life of the battery 11.

FIGS. 6-8 illustrate various embodiments of sending end of life and/or battery parameters to a user through a cloud network having a remote server. FIG. 6 is a block diagram of an embodiment of a method for sending information from the battery monitoring system 12 to a cloud based computing system via cellular phone communication protocols. As illustrated, a monitor signal 90 is generated by the battery monitoring system 12, and may include information such as the end of life of the battery 11, battery parameters, location of the vehicle, vehicle information, and/or battery type. The monitor signal is then sent to the transceiver 56, which then transmits the information as a transceiver signal 92. Although FIGS. 6-8 refer to a vehicle using a battery, some embodiments may include batteries used in any suitable transportation device or system having a battery (e.g., battery as auxiliary power). Accordingly, discussion referring to a vehicle may alternatively be used to refer to another suitable system (e.g., production line).

In the illustrated embodiment, the transceiver 56 may use various cellular phone data communication standards such as code division multiple access (CDMA), Long-Term Evolution (LTE), High Speed Packet Access (HPSA), IEEE 802.16 (WIMAX™), or other suitable cellular phone data communication standards including all-IP network communications. In such embodiments, the transceiver 56 may transmit the information using a cellular phone data communication standard via the antenna 60. The broadcast cell information is then received by a cell tower 94 and directed into a cell network 96. The cell network 96 interfaces with the Internet and sends the information to a cloud network 98. The cloud network 98 enables a user to access the information through cloud-based applications in a web browser or mobile application, for example. Accordingly, the information is stored on a remote server 62 that is remote from the user. In some embodiments, only battery parameter information is sent to the cloud network 98, and the cloud network 98 determines an end of life from the battery parameter information. Although the data is stored remotely from the user, the user may access the information through a database on the remote server using the Internet, for example. In some embodiments, the information may be kept private using secure data connections requiring login information or other identifying information before the information can be accessed. In certain embodiments, this information may be freely accessible by the user. Alternatively, the remote server may generate information to be sent to the user under certain conditions. For example, in some embodiments, when the lifetime of the battery 11 is determined to be less than a threshold value (e.g., less than 1, 2, 3, 4, 5, or 6 months until the end of the battery), a notification may be sent to the user. An electronic notification may be sent in any suitable format. For example, the remote server may automatically generate an email to the user, a message may be sent using short messaging service (SMS) or multimedia messaging service (MMS), a personalized mailing may be printed for sending through the postal service, or an automated voice message may be sent to the user.

FIG. 7 is a block diagram of an embodiment of a method for sending information from a battery monitoring system to a cloud based computing system via a cell phone connection. As illustrated, a monitor signal 102 is created by the battery monitoring system 12, and may include information such as the end of life of the battery 11, battery parameters, location of the vehicle/cell phone, vehicle information (e.g., vehicle model, location, engine size, etc.), and/or battery type. The monitor signal is then sent to the transceiver 56, which then transmits the information as a transceiver signal 104. The transceiver sends the information to a cell phone 106 using wireless radio connections. For example, some embodiments may broadcast the information using a Bluetooth connection between the transceiver and the cell phone. Other embodiments may broadcast the information to a cell phone using infrared wireless, ultra wideband (UWB) connections, near field communication (NFC), direct connections to the cell phone, or through cell phone peripherals (e.g., dongles and/or adapters). The transmitted information is received by the cell phone (e.g., using an application on the cell phone). The cell phone/application may then notify the user of relevant information, such as an estimated end of life of the battery, the nearest service locations, advertisements related to batteries, and the type of battery to be replaced. Additionally, the cell phone transmits the information to a cell tower 108, which conveys the information to a cell network 110. This transmittal of information may occur with or without the user's notice. For example, the application may run in the background of an operating system on the cell phone, thereby enabling the transmittal of information without user interaction. Thus, the information is sent to the remote server 62 in the cloud network 112, where it may be stored and processed for sending notifications to the user 114. In some embodiments, only battery parameter information is sent to the cell network 110, and the cloud network 112 determines an end of life from the battery parameter information. The cloud network 112 may then send a relevant notification to the user using SMS, MMS, email, phone, or mail, as previously discussed.

FIG. 8 is a block diagram view showing the creation of a notification using the battery monitoring system 12 through a wireless area network connection to notify a user through the remote server 62. As illustrated, a monitor signal 116 is created by the battery monitoring system 12 and may include information such as the end of life of the battery 11, battery parameters, location of the vehicle, vehicle information, and/or battery type. The monitor signal is then sent to the transceiver 56 which then transmits the information as a transceiver signal 118. In the illustrated embodiment, the transceiver 56 is connected to a wireless local area network (WiFi) 120. For example, the transceiver 56 may connect to a user's WiFi network when the vehicle 10 comes into range of the WiFi router, such as when the vehicle 10 is parked in a garage. Additionally or alternatively, the transceiver 56 may automatically detect and connect to publicly accessible WiFi hotspots. In some embodiments, the battery monitoring system may store authentication information to enable the transceiver to connect to dedicated WiFi networks at certain service and/or manufacture locations. Through the WiFi network 120 the information is transmitted to the remote server 62 in a cloud network 122. The information is stored in a database in the cloud network 122 on the remote server 62 for the user to access or to be sent to the user in a notification. Thus, the information is sent to the remote server 62 in the cloud network 122, where it is stored and processed for sending notifications 124 to the user. In some embodiments, only battery parameter information is sent to the cloud network 122, and the cloud network 122 determines an end of life from the battery parameter information. The cloud network 122 then sends a relevant notification to the user using SMS, MMS, email, phone, or mail, as previously discussed. Additionally, in some embodiments, the notification through a home WiFi may be displayed on a television or other display device in the home that is also connected to the WiFi network either directly (e.g., connects to WiFi router) or indirectly (e.g., coaxial connection to cable box that connects to a router).

In summary, various embodiments of the disclosure include a cloud network 98, 112, and 122 that sends a user notification signal 100, 114, and 124. In these embodiments, advertising data regarding vehicle batteries may be stored on the remote server 62. Additionally, relevant information regarding the vehicle (e.g., vehicle location, vehicle model, engine size, etc.) or a service station (e.g., service station location, inventory, available special price offers, etc.) may be stored in the remote server 62 to be sent by the cloud network 98, 112, or 122 to the user. Additionally, the cloud network 98, 112, or 122 may track the purchase of a previous battery and/or store a determined estimated end of life for the battery and sends appropriate information to the user based on the estimated end of life, position of the vehicle, available special price offers, service station inventory, and/or other suitable information.

The invention claimed is:

1. A battery monitoring network, comprising:
 a vehicle battery comprising a plurality of battery cells and configured to power components of a vehicle;
 a battery monitoring system integrated within the vehicle battery, wherein the battery monitoring system comprises:
  a diagnostic system configured to monitor one or more operational parameters of each battery cell of the plurality of battery cells and to determine one or more battery parameters of the vehicle battery based on the one or more operational parameters of the each battery cell, and
  a transmitter configured to transmit data indicative of the one or more battery parameters to a user's cellular phone via an infrared wireless link, wherein the user's cellular phone is configured to transmit the data to an Internet-connected remote server via a cellular network; and
 a cloud-based computing network comprising the Internet-connected remote server configured to:
  receive the data indicative of the one or more battery parameters from the transmitter via the infrared wireless link, the user's cellular phone, the cellular network, and the Internet;
  determine an end of life of the vehicle battery based, at least in part, on the one or more battery parameters; and
  in response to determining that the end of life of the vehicle battery is less than a predetermined value, send a notification to the user's cellular phone via the Internet and the cellular network, wherein the notification indicates the determined end of life of the vehicle battery.

2. The battery monitoring network of claim 1, wherein the notification includes the one or more battery parameters of the vehicle battery.

3. The battery monitoring network of claim 1, wherein the cellular network comprises code division multiple access (CDMA), Long-Term Evolution (LTE), High Speed Packet Access (HPSA), or IEEE 802.16 wireless link.

4. The battery monitoring network of claim 1, wherein the one or more battery parameters comprises a duration of use, a voltage, a temperature, a charge status of the vehicle battery, or a current of the vehicle battery.

5. The battery monitoring network of claim 1, wherein the battery monitoring system is activated when the battery monitoring system determines that a current drawn from the vehicle battery exceeds a threshold.

6. The battery monitoring network of claim 1, wherein the vehicle battery comprises a transparent or translucent window included in a housing of the vehicle battery to allow signals associated with the data transmitted by the transmitter to pass through the battery housing.

7. The battery monitoring network of claim 1, wherein the diagnostic system is configured to remain inactive until activated via an optical light signal from an infrared emitter of a maintenance device.

8. The battery monitoring network of claim 1, wherein the diagnostic system is configured to remain inactive until activated via an optical light signal from an infrared emitter of the user's cellular phone.

9. The battery monitoring network of claim 1, wherein the cloud-based computing network is configured to interface with a plurality of battery monitoring systems and determine a respective end of life for each vehicle battery of the plurality of battery monitoring systems.

10. A method for monitoring a vehicle battery, comprising:
monitoring one or more operational parameters of each battery cell of a plurality of battery cells of the vehicle battery via a battery monitoring system integrated within the vehicle battery, wherein the vehicle battery is configured to power components of the vehicle;
determining one or more battery parameters of the vehicle battery based on the one or more operational parameters of each battery cell;
transmitting, via a transmitter of the battery monitoring system, data indicative of the one or more battery parameters of the vehicle battery to a user's cellular phone via an infrared wireless link; and
transmitting, using the user's cellular phone, the data indicative of the one or more battery parameters of the vehicle battery to a cloud-based computing network comprising an Internet-connected remote server via a cellular network and the Internet; and
receiving a notification on the user's cellular phone via the cellular network and the Internet, wherein the notification indicates an end of life of the vehicle battery determined by the Internet-connected remote server, and wherein the end of life of the vehicle battery is less than a predetermined value.

11. The method of claim 10, wherein the notification comprises information associated with a replacement vehicle battery.

12. The method of claim 11, wherein the information associated with the replacement vehicle battery comprises a location to purchase, location to replace the vehicle battery, promotion related to a replacement vehicle battery, discount related to a replacement vehicle battery, incentive to replace vehicle battery, incentive to purchase from a location, advertisements related to a replacement vehicle battery, or some combination thereof.

13. The method of claim 11, comprising the Internet-connected remote server of the cloud-based computing network diagnosing a vehicle fault based on the one or more operational parameters of the each battery cell, wherein the notification comprises data indicative of the vehicle fault, and the vehicle fault comprises an issue that causes a premature end of life of the vehicle battery.

14. The method of claim 10, comprising the Internet-connected remote server of the cloud-based computing network:
monitoring a location of the vehicle battery via the cloud-based computing network; and
transmitting the location of the vehicle battery to a service location.

15. A battery monitoring network, comprising:
a vehicle battery configured to be installed in a vehicle to power components of the vehicle, wherein the vehicle battery comprises a plurality of battery cells;
a battery monitoring system integrated within the vehicle battery, wherein the battery monitoring system comprises a diagnostic system configured to monitor or to store at least one characteristic of the vehicle battery, wherein the battery monitoring system is configured to determine at least one characteristic of the vehicle battery based on one or more operational parameters of each battery cell of the plurality of battery cells, and a transmitter configured to transmit data indicative of the at least one characteristic of the vehicle battery via an infrared wireless link;
a user's cellular phone is configured to receive the data via the infrared wireless link and to transmit the data to an Internet-connected remote server via a cellular network; and
a cloud-based computing network comprising the Internet-connected remote server configured to;
receive the data from the transmitter via the user's cellular phone;
determine an end of life of the vehicle battery based, at least in part, on the one or more battery parameters: and
in response to determining that the end of life of the vehicle battery is less than a predetermined value, send a notification to the user's cellular phone via the Internet and the cellular network, wherein the notification indicates the determined end of life of the vehicle battery.

16. The battery monitoring network of claim 15, wherein the transmitter is configured to transmit data indicative of the at least one characteristic of the vehicle battery in response to a user input.

17. The battery monitoring network of claim 16, wherein the battery monitoring system comprises an optical wireless device configured to receive the user input.

18. The battery monitoring network of claim 15, wherein the diagnostic system is activated through an optical wireless connection to the user's cellular phone.

19. The battery monitoring network of claim 15, wherein the transmitter is configured to transmit the data indicative of the at least one characteristic of the vehicle battery to the user's cellular phone via the infrared wireless link interface.

20. The battery monitoring network of claim 15, wherein the user's cellular phone comprises an infrared dongle.

* * * * *